United States Patent [19]

Salzman

[11] Patent Number: 5,538,390

[45] Date of Patent: Jul. 23, 1996

[54] ENCLOSURE FOR LOAD LOCK INTERFACE

[75] Inventor: Philip M. Salzman, San Jose, Calif.

[73] Assignee: Applied Materials, Inc., Santa Clara, Calif.

[21] Appl. No.: 146,482

[22] Filed: Oct. 29, 1993

[51] Int. Cl.$^6$ .................................................. B65B 1/04
[52] U.S. Cl. ......................... 414/786; 414/217; 414/416; 414/937; 414/939; 414/490; 204/298.25; 118/719
[58] Field of Search ..................... 414/222, 225, 414/226, 403, 416, 217, 935, 937, 939, 940, 941, 786, 940; 118/719, 500; 204/298.25

[56] References Cited

U.S. PATENT DOCUMENTS

| | | | |
|---|---|---|---|
| 4,523,970 | 8/1985 | Tullis | 141/98 |
| 4,534,389 | 8/1985 | Tullis | 141/98 |
| 4,582,219 | 4/1986 | Mortensen | 220/326 |
| 4,668,478 | 5/1987 | Homer | 422/159 |
| 4,705,444 | 11/1987 | Tullis | 414/226 |
| 4,709,834 | 12/1987 | Mortensen | 220/326 |
| 4,724,874 | 2/1988 | Parikh et al. | 414/939 X |
| 4,746,256 | 5/1988 | Boyle et al. | 414/217 |
| 4,781,511 | 11/1988 | Harada et al. | 414/940 X |
| 4,826,360 | 5/1989 | Iwasawa | 406/51 |
| 4,990,047 | 2/1991 | Wagner | 414/217 |
| 4,995,430 | 2/1991 | Bonora | 141/98 |
| 5,044,871 | 9/1991 | Davis | 414/786 |
| 5,058,526 | 10/1991 | Matsushita | 118/715 |
| 5,092,728 | 3/1992 | Crabb | 414/217 |
| 5,112,277 | 5/1992 | Cruz | 454/195 |
| 5,226,781 | 7/1993 | Glachet et al. | 414/217 |
| 5,370,491 | 12/1994 | Bonora et al. | 414/416 X |
| 5,391,035 | 2/1995 | Krueger | 414/416 X |
| 5,433,574 | 7/1995 | Kawano et al. | 414/416 X |

FOREIGN PATENT DOCUMENTS

| | | | |
|---|---|---|---|
| 72112 | 4/1988 | Japan | 414/937 |
| 79317 | 4/1988 | Japan | 414/937 |
| 64335 | 3/1989 | Japan | 414/940 |
| 55344 | 3/1993 | Japan | 414/940 |

Primary Examiner—Frank E. Werner
Attorney, Agent, or Firm—Michael A. Glenn

[57] ABSTRACT

A load lock interface for a semiconductor wafer process chamber includes a platform adapted to receive and engage with a carrier containing a cassette of semiconductor wafers; and a removable bell-shaped enclosure adapted to surround and seal said carrier from the ambient environment while the carrier is engaged with the load lock interface platform. Once engaged with the carrier, the platform is operable to withdraw the cassette of wafers from the carrier and position the cassette within a load lock. Thereafter, the cassette may be indexed and individual wafers may be removed from the cassette for processing within the process chamber.

12 Claims, 3 Drawing Sheets

ENCLOSURE FOR LOAD LOCK INTERFACE

BACKGROUND OF THE INVENTION

TECHNICAL FIELD

The present invention relates to the handling and processing of semiconductor wafers. More particularly, the present invention relates to loading and unloading a cassette of wafers in a wafer processing chamber.

DESCRIPTION OF THE PRIOR ART

Semiconductor wafer handling and processing have always required extreme care to avoid contamination due to ambient and process borne particles. Such contamination lowers process yields, thus making the manufacture of integrated circuits more expensive and time consuming. Thus, as device features of less than 0.5 µm become prevalent, a clean room environment of less than class 1, i.e. an environment having less than one contaminant particle of dimension less than or equal to 0.5 µper 0.3 $m^3$ ($ft^3$) of clean room volume, is generally required.

At the present level of integration, semiconductor processes are critically sensitive to any contamination. Accordingly, one goal of semiconductor manufacturers is to avoid as much as possible exposing semiconductor wafers to sources of contamination. Class 1 conditions require that processed or partially processed wafers must be bagged when transported to subsequent processing facilities or to outside analysis or other systems. Industry practice is to place semiconductor wafers in spaced stacks, referred to as cassettes, and to place these cassettes into various types of microenvironments, such as sealed containers, for example in the standard mechanical interface (SMIF) box of the type manufactured by Asyst Technologies, Inc. of Milpitas, Calif. Such SMIF-type boxes provide a sealed environment in which the cassette is readily transported under conditions that tend to minimize the potential for wafer contamination. The interior of the SMIF-type box is typically sealed by placing a removable base or lid on the box to form an integrated, airtight assembly. Withdrawal of the cassette from the SMIF-type box for wafer loading/unloading is accomplished by several different methods, for example a pressure differential may be provided at the base of the SMIF-type box, such that the base and cassette of wafers is pulled from the SMIF-type box, or the base of the SMIF-type box may be mechanically engaged with a platform and/or support, etc. In this way, wafer exposure to the ambient environment is reduced during wafer handling, thus limiting the possibility that particles can fall onto and contaminate the wafers. See, for example Bonora et al (U.S. Pat. No. 4,995,430) and Mortensen et al (U.S. Pat. Nos. 4,709,834 and 4,582,219).

Another opportunity for wafer contamination occurs when the wafers are loaded to and unloaded from processing chambers during the manufacture of integrated circuits. During such operation, residual particles are stirred and circulated as the processing chamber is pumped and/or vented to establish operating pressures or to restore loading pressures. The arrangement of the interface between the processing chamber and the wafer carrier, i.e. the load lock, is critical to maintaining a clean environment within the processing chamber because the load lock is one point at which particles frequently have the opportunity to enter the process chamber.

Examples of a prior art wafer transfer mechanisms include Iwasawa et al (U.S. Pat. No. 4,826,360), in which a transfer vehicle carrying a wafer pod is shuttled through a transfer tube by application of a negative pressure within the tube; Bonora et al (U.S. Pat. No. 4,995,430) which is discussed above; Davis et al (U.S. Pat. No. 5,044,871) in which a nonstandard bell-shaped carrier is maintained under vacuum for wafer transport; Crabb et al (U.S. Pat. No. 5,092,728) in which wafers are loaded into a receiving chamber to permit purging; Cruz et al (U.S. Pat. No. 5,112,277) in which wafers are loaded into a purging chamber; Wagner et al (U.S. Pat. No. 4,990,047) in which multiple wafers are handled within a process chamber; Matsushita et al (U.S. Pat. No. 5,058,526) in which a CVD apparatus includes an internal wafer and cassette transfer mechanism; Tullis et al (U.S. Pat. Nos. 4,532,970; 4,534,389; and 4,705,444) in which an atmospheric wafer carrier is docked to a load lock in a process chamber.

In Davis the wafers are carried upside down, which requires that the wafers be processed using unconventional techniques. Both Bonora and Davis place a sealed wafer container in a first chamber which encloses the container. Once the first chamber is sealed and evacuated, the wafer container is opened and the wafer cassette contained therein is transferred to a second chamber. Each wafer is then transferred from the second chamber to a process chamber where the wafer is processed. The wafer is then returned to the wafer cassette and the next wafer is selected and processed, and so on until every wafer in the cassette has been processed.

Crabb and Cruz both require a purge step before wafer transfer can occur. While purging may evacuate particles from the process environment before wafer loading, purging also stirs up residual particles such that those particles not evacuated during purging are likely to settle on the surface of the wafers within the processing chamber.

Thus, the state of the art is such that wafers contained within a wafer carrier must be loaded to or unloaded from a process chamber by an intermediate chamber into which the wafer cassette is first placed and which is then purged prior to wafer loading. Each step associated with interfacing the carrier to the process chamber takes time, subjects the wafers to excessive handling, and provides opportunities for wafer contamination. A system for directly loading wafers to a process chamber would improve process throughput, increase device yield per wafer, and thereby reduce manufacturing cost.

SUMMARY OF THE INVENTION

The invention provides a system for loading wafers situated within a carrier to and from a process environment. The carrier is attached to a load lock that has a platform arranged for complementary engagement with a carrier base. The load lock is operable, when engaged with the carrier base, to load wafers to and from a process environment in a vacuum. A removable enclosure is placed over the carrier after the carrier is docked to the load lock, typically before processing commences. The enclosure is adapted to surround and seal said carrier from the ambient environment while the carrier is engaged with said platform. The enclosure acts as a temporary chamber about the carrier that prevents the influx of particles to the load lock while a carrier is docked thereto; and that also provides an environment which may be purged to remove any particles trapped within the enclosure.

The enclosure is especially useful for equalizing the pressure differential on the walls of the carrier, which are typically formed from lightweight materials, such as plastic, and which are not able to withstand pressure differentials incurred during wafer processing and/or transport without deforming, or failing altogether. Thus, the enclosure allows the carrier to be placed under processing chamber pressures while docked to the load lock without suffering any damage.

DETAILED DESCRIPTION OF THE INVENTION

Figure 1:
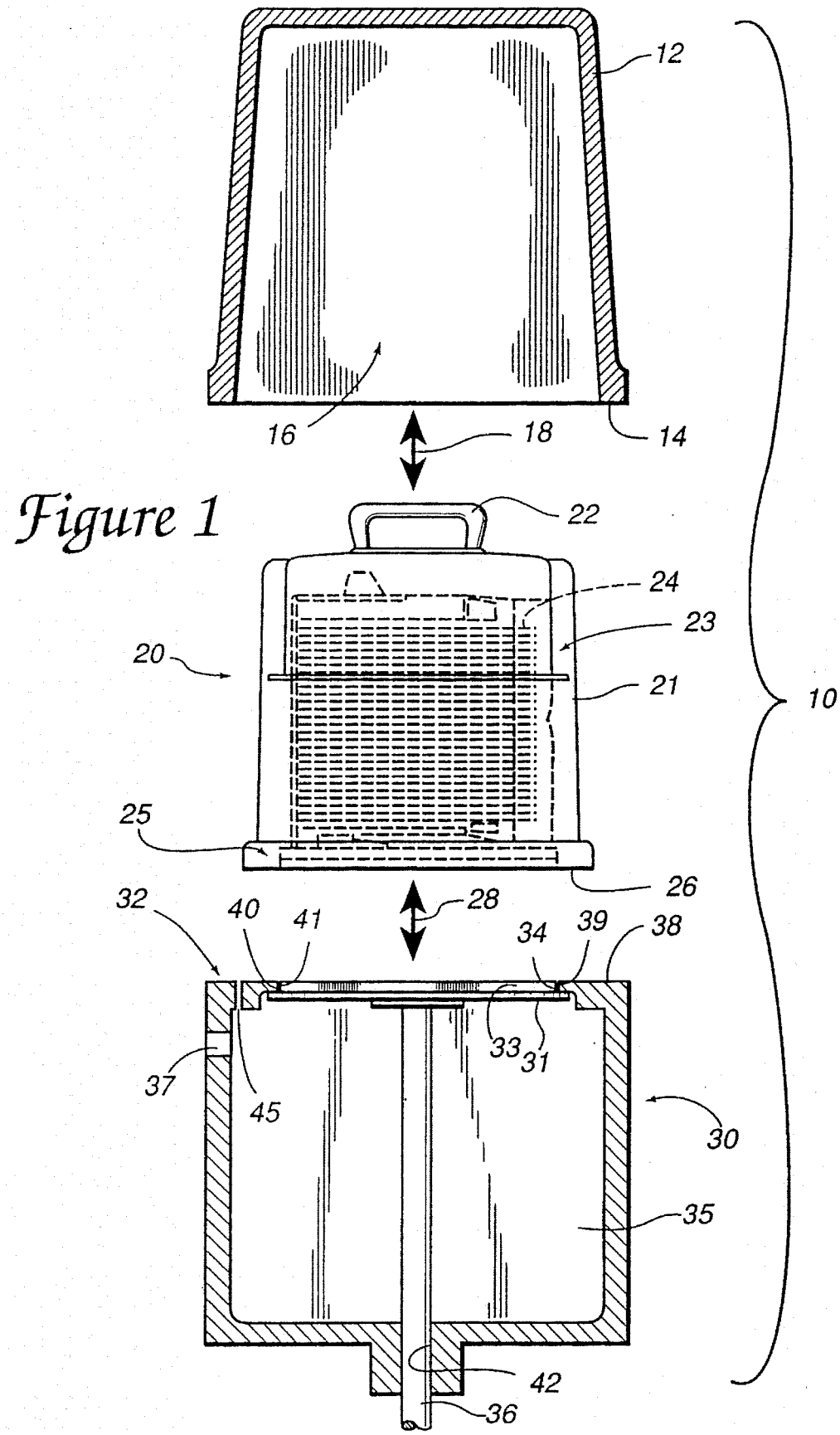
FIG. 1 is a schematic side elevation showing an enclosure and a load lock interface in cross section according to the present invention.

The invention can be used with a system 10 for docking a wafer carrier that contains a cassette of wafers directly to the load lock of a processing chamber. The system minimizes wafer exposure to sources of contamination and reduces wafer handling, thereby improving manufacturing throughput and device yield per wafer. In FIG. 1, which is a schematic side elevation showing a wafer handling system according to the present invention, a SMIF-type box 20 is shown positioned above a processing chamber load lock 30. A line 28 having an arrow at each end shows a path of engagement and disengagement of the SMIF-type box and the load lock during system operation.

The typical SMIF-type box 20 is manually transported by a handle 22 and contains a cassette 23 that holds a plurality of semiconductor wafers 24 in a spaced fashion. The wafers are protected from the ambient during transport by a surrounding outer surface 21 of the SMIF-type box. The SMiF-type box is supported on a peripheral base 26 and includes an interface 25 that is adapted to dock with a complementary interface, usually provided by a special SMIF-type box robot assembly. It is understood from FIG. 1 that the base 26 is readily docked with a complementary surface, where such surface has any angular orientation, such as a horizontal or a vertical orientation. One feature of the invention is the provision of a load lock interface 32 that interfaces the SMIF-type box directly to a processing chamber load lock.

The SMIF-type box may be substituted by any type of microenvironmental chamber that is hermetically sealed, including those that are maintained at atmospheric pressure, or that are placed under full or partial vacuum. The SMIF-type box shown in FIG. 1 is provided as an example of the type of wafer carrier that may be used in practicing the invention. The invention is not limited to the specific SMIF-type box shown.

The load lock 30 defines an inner volume 35 that is adapted to receive the cassette 23 during wafer loading and unloading, and which is semipermanently attached to a processing apparatus to and from which a robot loads wafers through a wafer port 37. An indexer 36 is coupled to a platform 33 for precision movement of said platform 33; the platform is adapted to support the base of the SMIF-type box, and therefore the cassette 23, such that the cassette may be lowered or raised by the indexer 36 to accomplish wafer loading and unloading through the wafer port 37. A bushing 42 seals the indexer such that the integrity of the load lock inner volume 35 is maintained during operation of the indexer.

The SMIF-type box 20 is docked to the load lock 30 by complementary engagement of the SMIF-type box interface 25 with the interface 32 of the load lock. The platform 31 is also configured to have edges 39 and 40 that abut load lock edges 34 and 41 to seal the load lock inner volume 35 when the SMIF-type box is not docked to the load lock and the upper surface of the load lock is therefore exposed to the ambient. The indexer should include a brake or locking mechanism, such as a pneumatic or hydraulic cylinder, to secure the platform against movement when the load lock does not have a carrier docked thereto. In this way, the integrity of the seal provided by the platform may be maintained, for example under processing conditions which would typically expose the upper surface of the platform to a large pressure differential.

A bell-shaped enclosure 12, defining therein an inner volume 16, is provided to surround and seal the SMIF-type box from the ambient while the SMIF-type box 20 is docked to the load lock 30 for wafer loading and unloading. A line 18 having an arrow at each end shows a path of engagement and disengagement of the enclosure 12 and the load lock 30 during system operation. The enclosure 12 includes a base perimeter edge 14 that is adapted to engage with a complementary edge 38 of the load lock and hermetically seal the interior volume 16 defined by the enclosure 12. The seal between the enclosure and the load lock may be accomplished by any known technique, such as the use of a gasket; an O-ring; a threaded, screw, or bayonet engagement; a highly machined or grooved surface; etc.

Although a bell-shaped enclosure 12 is shown in the figure, for purposes of practicing the invention, it is only necessary that the enclosure contain the wafer carrier and seal the carrier from the ambient while the carrier is docked to the processing chamber load lock. Thus, the actual shape of the enclosure is chosen as appropriate.

Figure 2:
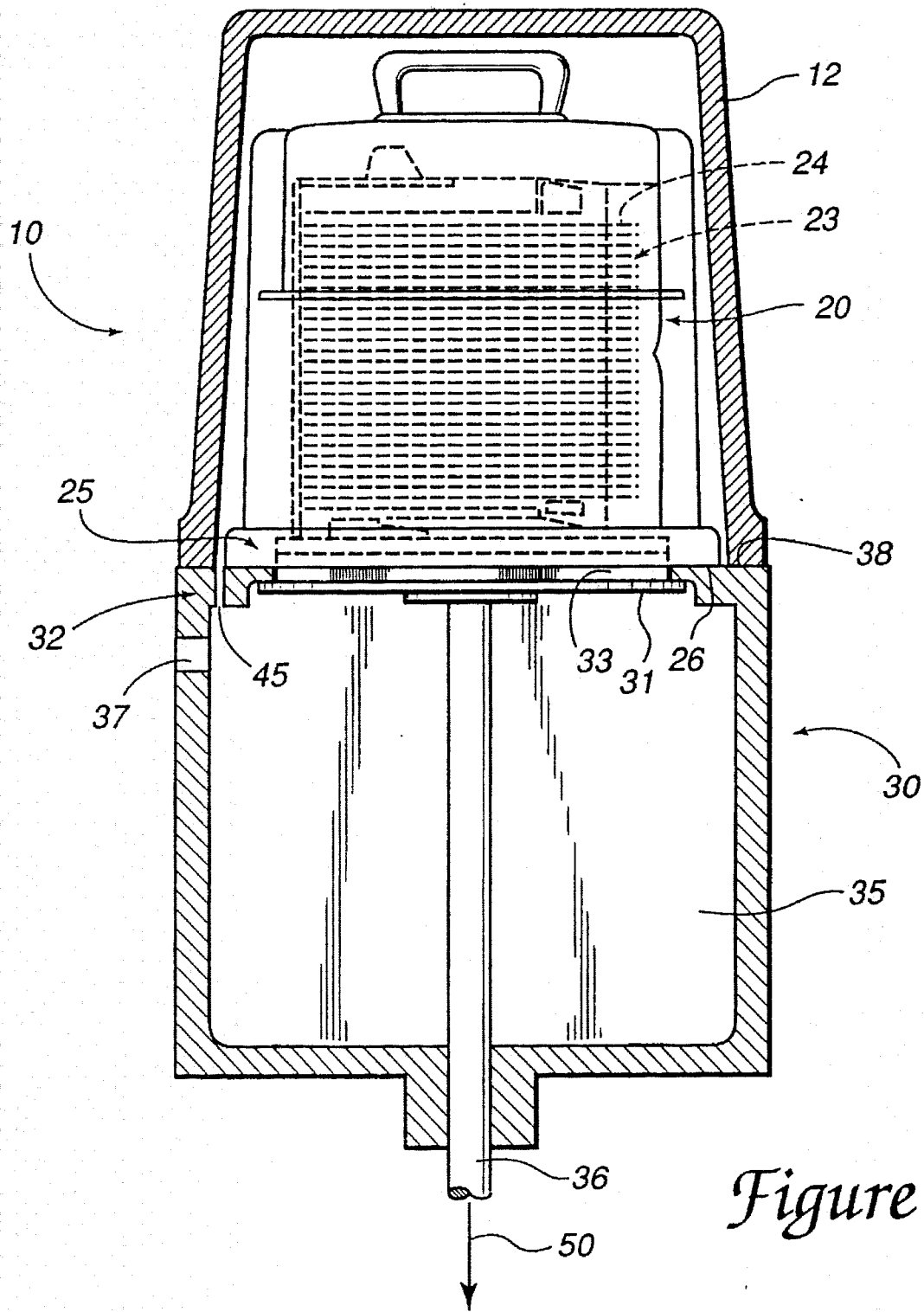
FIG. 2 is a schematic side elevation showing in cross section an enclosure engaged with a load lock interface according to the present invention.

FIG. 2 is a schematic side elevation showing in cross section the enclosure 12 engaged with the load lock 30 and surrounding a SMIF-type box 20 according to the present invention. The figure shows the SMIF-type box 20 as it appears just before or after wafer loading/unloading, i.e. while the load lock inner volume 35 is sealed and the SMIF-type box is engaged with the load lock platform 31. For purposes of the discussion herein in connection with FIG. 2, it will be assumed that the SMIF-type box 20 has just been engaged with the load lock 30, and that the enclosure 12 has just been placed over the SMIF-type box to seal the SMIF-type box from the ambient. The load lock 30 may include a pumping or purging device (not shown) for establishing and maintaining consistent pressure within the volume defined by the enclosure 12 while the SMIF-type box 20 is engaged with the load lock 30. Pumping the enclosed inner volume removes particles from the enclosed area that may have become trapped therein when the enclosure was placed around the SMIF-type box, or that may have been picked up by the SMIF-type box during transport, etc. Accordingly, if the inner volume of the enclosure is pumped in connection with the invention, such pumping should take place after the enclosure is secured to and in sealed engagement with the load lock and before the SMIF-type box is opened to lower the cassette of wafers into the load lock volume.

It has been found that it is also important to mitigate the pressure differential within and without said carrier that results from pump down attendant with wafer loading because most SMIF-type boxes are made of lightweight plastic materials that are not able to withstand the processing pressures typically found in a processing chamber. If a standard SMIF-type box were interfaced directly to a load lock and the cassette of wafers drawn therefrom without such pressure equalization, the resulting pressure differential, between that of the processing chamber and that of the ambient, on the walls of the SMIF-type box would cause the shape of SMIF-type box to become distorted, and thus impair its ability to maintain a seal at its base. As a result, the integrity of the wafer processing system would be breached. Worse yet, it is possible that the SMIF-type box could fail entirely, e.g. it could shatter, thereby damaging an expensive load of wafers, and possibly damaging the processing chamber.

Thus, an important function of the enclosure is to provide a rigid, airtight chamber that surrounds the SMIF-type box during varying conditions of pressure and that functions in concert with the load lock to maintain a pressure equilibrium on the inner and outer surfaces of the SMIF-box walls. Accordingly, the enclosure is preferably vented to the load lock and/or coupled to a pumping system through a vent or port 45 which may be formed in the upper surface of the load lock 30, such that the pressures within the load lock and the enclosure are equalized during wafer loading and unloading. Additionally, the port 45 may be used to purge the enclosure prior to wafer loading or unloading to remove any particles that may have been trapped within the enclosure, at the base of the SMIF-type box, or on the surface of the platform.

Other venting, purging, and pumping techniques may be used with the invention. For example the enclosure may be fitted with a pressure conduit and thereby coupled to a pump, or wafer port 37 may be used as a pumping and/or venting port, etc. Such other pumping and venting schemes are well known in the art and are therefore not shown in the figures.

The enclosure must be made of a material that is strong enough to withstand the varying pressures encountered within the processing chamber (i.e. pressure differentials that result from the internal vacuum of the processing chamber), that is process inert (i.e. that will not be affected by residual processing gases, etc.), and that does not generate particles, for example by shedding or flaking (i.e. that will not generate particles that may become a source of wafer contamination). Such materials, which are well known, may be selected as appropriate and may include, for example aluminum, stainless steel, or ceramic materials.

The preferred embodiment of the invention therefore provides a wafer handling system in which a SMIF-type box is docked to a processing chamber load lock that has an interface adapted to engage with that of the SMIF-type box. An enclosure is placed over the SMIF-type box and engaged with the load lock to seal the inner volume of the enclosure from the ambient, and thereby seal the SMIF-type box from the ambient during wafer loading and unloading. The enclosure may be purged before wafer loading/unloading is commenced. The SMIF-type box is then opened and the cassette of wafers is drawn from the SMIF-type box. During the time that the SMIF-type box is opened or sealed, the enclosure is preferably pumped or vented to equalize the pressure on the walls of the SMIF-type box. The cassette is then moved in an indexed fashion such that individual wafers may be precisely loaded to or from the cassette by a processing chamber robot (not shown).

Figure 3:
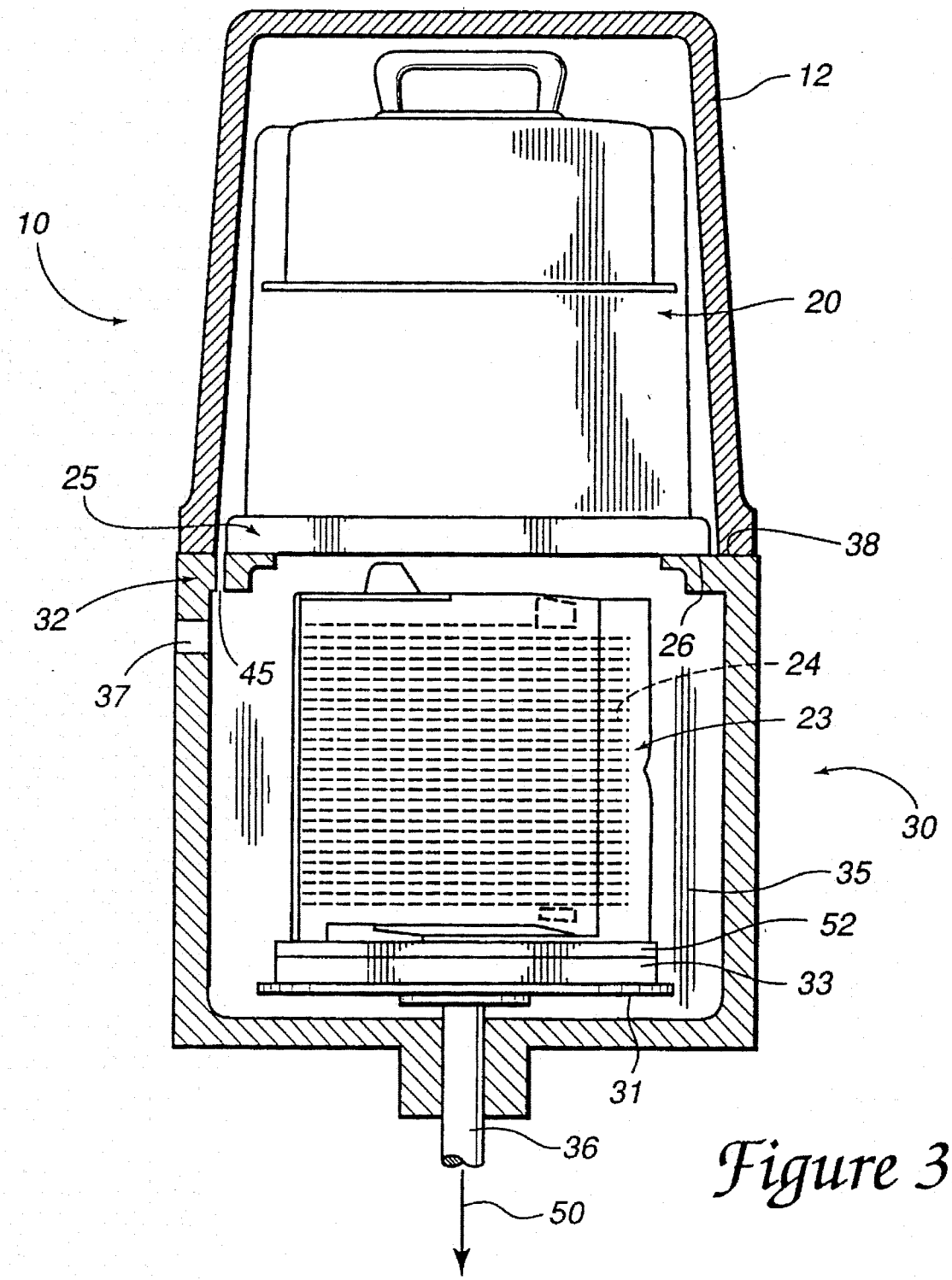
FIG. 3 is a schematic side elevation showing in cross section an enclosure engaged a load lock interface, and also showing a cassette of wafers loaded into a process chamber according to the present invention.

FIG. 3 is a schematic side elevation showing in cross section a cassette 23 of wafers 24 loaded into the chamber 35 of the load lock 30 according to the present invention. In the figure, a cassette 23 is raised or lowered by the indexer 36, as indicated by a line 50 having an arrow at each end which shows the direction of indexer movement, to align individual wafers with the wafer port 37, such that the wafers may be passed through the port 37 by operation of a processing chamber robot. The cassette 23 includes a base portion 52 that is engaged with or rests upon a load lock platform support 33. Actual withdrawal of the cassette from the SMIF-type box for wafer loading/unloading may be accomplished by any acceptable method, for example a pressure differential may be provided at the base of the SMIF-type box, such that the base and cassette of wafers is pulled from the SMIF-type box, or the base of the SMIF-type box may be mechanically engaged with the load lock platform and/or platform support, etc.

Although the invention is described herein with reference to the preferred embodiment, one skilled in the art will readily appreciate that other applications may be substituted for those set forth herein without departing from the spirit and scope of the present invention. For example, although the embodiment of the invention depicted herein shows a SMIF-type box in which the cassette carries a load of wafers in a horizontal plane, and in which the cassette is received at the top of a load lock, the invention is readily applicable to wafer carriers in which a cassette of wafers is loaded in a vertical plane; and further may be applied to load locks in which wafers are received at a side or bottom portion of the load lock. Additionally, the invention may be provided at a central load lock location from which a robot serves several processing pods or locations. Accordingly, the invention should only be limited by the Claims included below.

I claim:

1. In a load for a microenvironment wafer carrier, said load lock including a movable platform, said load lock movable platform arranged for complementary engagement with a movable base portion of said wafer carrier, said load lock including removable enclosure having a base perimeter edge, said enclosure being adapted to surround said wafer carrier and to engage with a load lock outer edge and seal said load lock, said load lock having side walls joined to a base portion thereof to define a first inner volume, said load lock further comprising a wafer port in communication with a process environment, said wafer carrier further comprising side walls joined to an upper wafer carrier portion to define a second inner volume that is adapted to surround a cassette holding a plurality of semiconductor wafers, the method comprising the steps of:

placing said wafer carrier on said load lock, wherein a bottom surface of said wafer carrier movable base contacts a top surface of said load lock movable platform:

surrounding said wafer carrier with said removable enclosure, wherein said base perimeter edge of said enclosure engages with said outer edge of said load lock to hermetically seal a third second inner volume defined by said enclosure, and thereby surround and seal said wafer carrier from an ambient environment while said wafer carrier is placed on said load lock platform;

equalizing ambient pressures in said first, second, and third inner volumes defined by said enclosure, said load lock and said wafer carrier:

moving said load lock platform downward to separate said movable base portion from said wafer carrier and thereby lower said cassette into said first inner volume to effect transfer of said wafers between said process environment and said load lock; and passing individual wafers from said cassette through said wafer port between said load lock and said process environment.

2. The method of claim 1, wherein said carrier is a SMIF-type box.

3. The method of claim 1, further comprising the steps of:

establishing and maintaining consistent pressure within said enclosure while said carrier is engaged with said load lock, thereby mitigating a pressure differential within and without said carrier during wafer loading and/or unloading.

4. The method of claim 1, wherein said ambient pressures in said inner volumes of said removable enclosure, load lock and carrier are equalized prior to said step of vertically lowering said platform.

5. The method of claim 1, wherein said ambient pressures in said inner volumes of said removable enclosure, load lock and carrier are equalized subsequent to said step of vertically lowering said platform.

6. The method of claim 1, wherein said upper surface of said load lock defines a vacuum port, and wherein said pumping means equalizes said ambient pressures in said inner volumes of said removable enclosure, load lock and carrier through said vacuum port.

7. The method of claim 1 wherein a vacuum port is defined through said side walls or ceiling of said removable enclosure, and further comprising the steps of:

fitting a pressure conduit to said vacuum port; and coupling said pressure conduit to said pumping means, wherein said pumping means equalizes said ambient pressures in said inner volumes of said removable enclosure, load lock and carrier through said pressure conduit.

8. The method of claim 1, further comprising the step of connecting said pumping means to said wafer port, wherein said pumping means equalizes said ambient pressures in said inner volumes of said removable enclosure, load lock and carrier through said wafer port.

9. The method of claim 1, wherein said platform is moved vertically by an indexer.

10. The method of claim 1, wherein said individual wafers from said cassette are passed through said wafer port and into said processing environment by a robot.

11. The method of claim 1, wherein said cassette is separated from said carrier by a pressure differential at said base of said carrier.

12. The method of claim 1, further comprising the step of engaging said base of said carrier with said load lock platform, wherein said cassette is removed from said carrier by the downward vertical movement of said platform.

* * * * *